(12) United States Patent
Kim

(10) Patent No.: US 8,209,585 B2
(45) Date of Patent: Jun. 26, 2012

(54) APPARATUS AND METHOD FOR GENERATING LOW DENSITY PARITY CHECK CODES FOR SEQUENTIAL DECODING ALGORITHM

(75) Inventor: Sung-Hwan Kim, Suwon-si (KR)

(73) Assignee: Samsung Electronics Co., Ltd, Suwon-si (KR)

(*) Notice: Subject to any disclaimer, the term of this patent is extended or adjusted under 35 U.S.C. 154(b) by 857 days.

(21) Appl. No.: 12/333,148

(22) Filed: Dec. 11, 2008

(65) Prior Publication Data

US 2009/0158116 A1 Jun. 18, 2009

(30) Foreign Application Priority Data

Dec. 14, 2007 (KR) .................. 10-2007-0131534

(51) Int. Cl.
*H03M 13/00* (2006.01)
(52) U.S. Cl. ........................................ 714/758
(58) Field of Classification Search .............. 714/758
See application file for complete search history.

(56) References Cited

U.S. PATENT DOCUMENTS

| | | | |
|---|---|---|---|
| 7,058,873 B2 * | 6/2006 | Song et al. ............ | 714/752 |
| 7,178,082 B2 * | 2/2007 | Yu et al. ............... | 714/752 |
| 7,243,286 B2 * | 7/2007 | Kim et al. ............. | 714/752 |
| 7,418,649 B2 * | 8/2008 | Li .......................... | 714/784 |
| 7,493,547 B2 * | 2/2009 | Kim et al. ............. | 714/758 |
| 7,536,623 B2 * | 5/2009 | Kim et al. ............. | 714/752 |
| 7,590,914 B2 * | 9/2009 | Kim et al. ............. | 714/752 |
| 7,949,932 B2 * | 5/2011 | Yang ..................... | 714/800 |

* cited by examiner

*Primary Examiner* — Amine Riad
(74) *Attorney, Agent, or Firm* — Jefferson IP Law, LLP

(57) ABSTRACT

A method for generating a Low Density Parity Check (LDPC) code is provided. The method includes generating subsets each including a same number of check nodes, connecting each of variable nodes to the check nodes of the subsets so that the each of subsets is equal in degree or a difference in degree between the subsets becomes a maximum of 1, setting elements corresponding to check nodes connected to each of the variable nodes, to a non-zero value, and generating a parity check matrix H having rows corresponding to the check nodes and columns corresponding to the variable nodes.

10 Claims, 15 Drawing Sheets

APPARATUS AND METHOD FOR GENERATING LOW DENSITY PARITY CHECK CODES FOR SEQUENTIAL DECODING ALGORITHM

PRIORITY

This application claims the benefit under 35 U.S.C. §119 (a) of a Korean patent application filed in the Korean Intellectual Property Office on Dec. 14, 2007 and assigned Serial No. 10-2007-0131534, the entire disclosure of which is hereby incorporated by reference.

BACKGROUND OF THE INVENTION

1. Field of the Invention

The present invention relates to a mobile communication system. More particularly, the present invention relates to an apparatus and method for generating Low Density Parity Check (LDPC) codes for sequential decoding.

2. Description of the Related Art

As mobile communication systems have been rapidly developing, there is an increasing demand for the development of technologies capable of transmitting a large volume of data in a wireless network with a similar level of performance to that of a wired network. To address the demand for a high-speed capable service, high-capacity communication systems are being developed that are capable of processing and transmitting a variety of information such as image and wireless data, beyond the voice-oriented services. The high-capacity communication systems being developed increase the system transmission efficiency using a channel encoding scheme that improves system performance. Therefore, the next-generation mobile communication system requires high-performance channel codes. To meet the above identified demands, research is being conducted on Low Density Parity Check (LDPC) codes that have superior binary error rate performance (i.e. lower binary error rate) through iterative decoding.

The LDPC codes are each defined by a parity check matrix H, and its performance is also determined according to a characteristic of the matrix H. Therefore, there is a need for a method for generating a high-performance matrix H.

FIG. 1 is a conceptual diagram schematically illustrating structures of a transmission part and a reception part of a communication system according to the conventional art.

Referring to FIG. 1, when a signal input to an input unit 100 is assumed to be i, the input unit 100 outputs the input signal i to a channel encoder 102. The channel encoder 102 channel-encodes the signal i with a preset channel encoding scheme, and outputs the channel-encoded signal c to a modulator 104. The modulator 104 modulates the signal c with a preset modulation scheme, and outputs the modulated signal m to a transmitter 106. The transmitter 106 performs transmission processing on the modulated signal m, and transmits the transmission-processed signal s to a reception part through a channel 108. The structure from the input unit 100 to the transmitter 106 corresponds to the transmission part of the communication system.

The reception part for restoring the signal received through the channel 108 is made in a reverse process of the transmission part. A receiver 110 performs reception processing on a signal r received through the channel 108, and outputs the reception-processed signal m' to a demodulator 112. The demodulator 112 demodulates the signal m' with a demodulation scheme corresponding to the modulation scheme of the modulator 104, and outputs the demodulated signal c' to a channel decoder 114. The channel decoder 114 channel-decodes the signal c' with a channel decoding scheme corresponding to the channel encoding scheme of the channel encoder 102, and outputs the channel-decoded signal i' to an output unit 116. The structure from the receiver 110 to the output unit 116 corresponds to the reception part of the communication system.

The LDPC codes used in the transmission part of the communication system are a type of linear codes, and are defined as a parity check matrix in which the number of elements having a non-zero value is less than the number of elements having a zero value. The LDPC codes, which were originally proposed by Gallager in the early 1960s, are presently undergoing research in several fields as they were rediscovered in the late 1990s together with an increased interest in the codes capable of undergoing iterative decoding. The research on the LDPC codes is roughly divided into research on an algorithm for the generation of codes and research on an algorithm for the decoding the codes. Compared with turbo codes, which are another example of codes capable of undergoing iterative decoding, the LDPC codes are lower in decoding complexity, but have a greater encoding complexity. Therefore, research is being conducted on the design of the LDPC codes with reduced encoding complexity, or the LDPC codes that have a higher error correction performance.

Herein, the LDPC codes are expressed as a parity check matrix H in order to easily describe a structure of the LDPC codes. Meanwhile, when the parity check matrix H is expressed with a bipartite graph, rows of the parity check matrix H are associated with (or mapped to) check nodes, and columns of the parity check matrix H are associated with variable nodes. In the parity check matrix H, elements having a non-zero value are associated with edges between check nodes and variable nodes of the corresponding elements. Rows, columns and elements having a non-zero value of the parity check matrix H are used to denote similar meanings as check nodes, variable nodes and edges of the bipartite graph, respectively. In addition, when the parity check matrix H is expressed with the bipartite graph, the parity check matrix H can be expressed by distribution of degrees of the variable nodes and check nodes, and an arrangement of edges between the variable nodes and check nodes. A generation method of the parity check matrix H is determined by these two matters (i.e. degree distribution and edge arrangement). The term 'degree' as used herein refers to the number of edges connected to each of the variable nodes or check nodes. That is, as for an arbitrary variable node, if the number of edges connected to the variable node is assumed to be 2, a degree of the variable node is 2.

For general binary codes, the parity check matrix H is composed of values of '0' and values of non-zero, for example, '1'. The method of generating the parity check matrix H first determines a degree of each variable node through a density evolution function, and arranges '1's according to the determined degree. That is, the method connects edges between the variable nodes and the check nodes according to the determined degree. Typically, the algorithm for arranging '1's in the parity check matrix H includes a Progressive Edge Growth (PEG) algorithm. The PEG algorithm, when connecting edges while sequentially adding variable nodes on the bipartite graph, connects one edge, and then selects and connects one edge among the edges so that a cycle passing through the variable nodes becomes the longest in the tree structure made at this time. The term 'cycle' as used herein refers to a series of edges when the edges connected beginning at a node return to their first start node. A length of the cycle refers to the total number of edges constituting the cycle.

Using the cycle concept, it is possible to increase a partial girth by connecting edges so that they have a longer cycle if possible at a small-sized code. The term 'girth' as used herein refers to a length of the shortest cycle among several cycles. Besides, the algorithm for arranging '1's in the parity check matrix H includes an Approximate Cycle Extrinsic (ACE) algorithm for connecting edges such that when a short cycle is generated, there are many edges connected to the exterior.

In this way, the existing PEG algorithm or most methods similar thereto, are aimed at generating the parity check matrix H so that a length of the partial cycle increases. In addition, the parity check matrix H generated with the PEG algorithm is better in cycle characteristic than the randomly generated parity check matrix H, and use of a sum-product algorithm can improve code performance since independency between messages is secured at an initial iteration.

Meanwhile, a decoding algorithm can be defined on the bipartite graph, and in this case, flooding scheduling, which is a parallel decoding, can be applied. However, in actual realization of the decoding algorithm, a sequential decoding scheme having a lower complexity is implemented since the parallel decoding scheme has very high complexity. Further, the sequential decoding scheme is used because when a parity check matrix H is generated with the general PEG algorithm in the parallel decoding scheme, information obtained therethrough is not reflected in the information obtained from the next subset, or a ratio of the reflection, if any, can decrease. Therefore, it is possible to expect an improvement of decoding performance by designing the parity check matrix H in consideration of sequential decoding.

SUMMARY OF THE INVENTION

An aspect of the present invention is to address at least the above-mentioned problems and/or disadvantages and to provide at least the advantages described below. Accordingly, an aspect of the present invention is to provide an apparatus and method, which is suitable for sequential decoding, for generating Low Density Parity Check (LDPC) codes such that a length of a partial cycle increases.

Further, an aspect of the present invention is to provide an apparatus and method for generating LDPC codes such that many message updates are made during less iterations in sequential decoding by uniformly arranging the edges connected between variable nodes and check node subsets, if possible.

In accordance with an aspect of the present invention, an apparatus for generating an LDPC code is provided. The apparatus includes a channel matrix generator for generating subsets each including a same number of check nodes, for connecting each of variable nodes to the check nodes of the subsets so that the each of subsets is equal in degree or a difference in degree between the subsets becomes a maximum of 1, for setting elements corresponding to check nodes connected to each of the variable nodes, to a non-zero value, and for generating a parity check matrix H having rows corresponding to the check nodes and columns corresponding to the variable nodes.

In accordance with another aspect of the present invention, a method for generating an LDPC code is provided. The method includes generating subsets each including a same number of check nodes, connecting each of variable nodes to the check nodes of the subsets so that the each of subsets is equal in degree or a difference in degree between the subsets becomes a maximum of 1, setting elements corresponding to check nodes connected to each of the variable nodes, to a non-zero value, and generating a parity check matrix H having rows corresponding to the check nodes and columns corresponding to the variable nodes.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description when taken in conjunction with the accompanying drawings, in which.

Throughout the drawings, it should be noted that like reference numbers are used to depict the same or similar elements, features and structures.

DETAILED DESCRIPTION OF EXEMPLARY EMBODIMENTS

Figure 1:
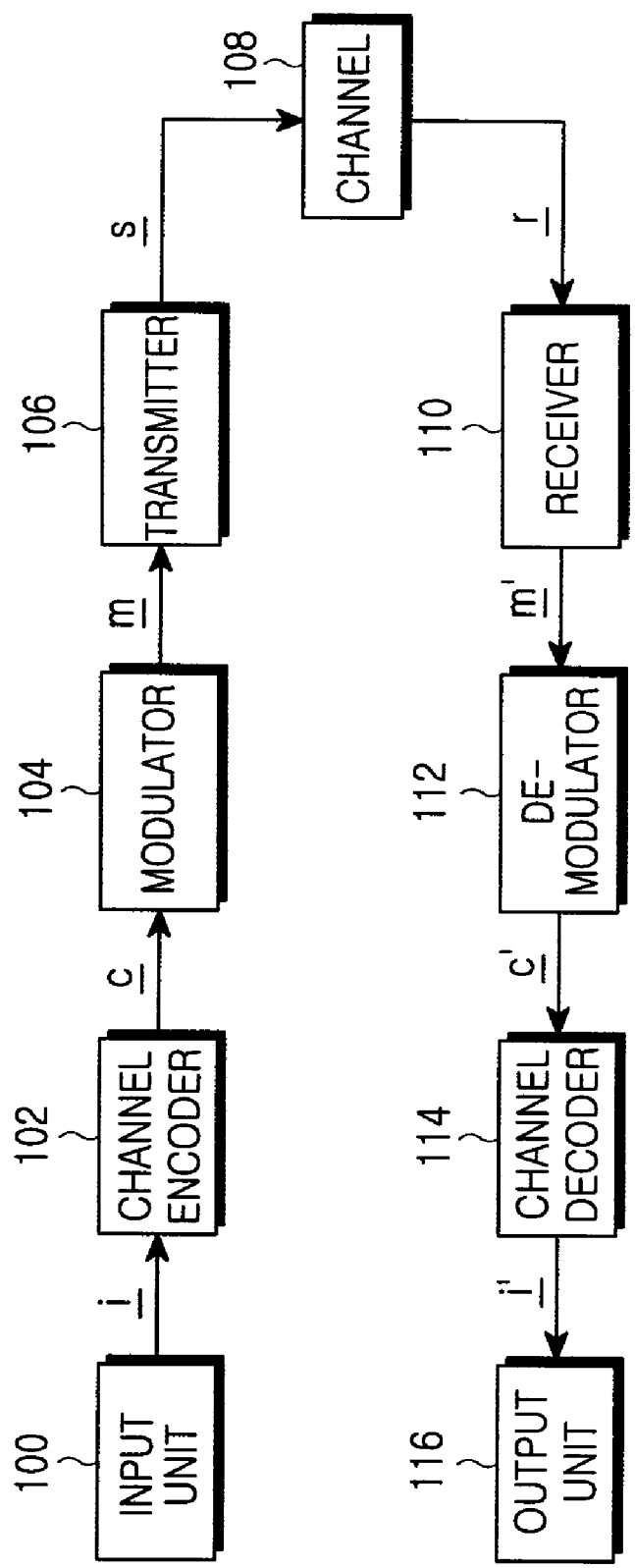
FIG. 1 is a diagram schematically illustrating structures of a transmission part and a reception part of a communication system according to the conventional art.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

A method for generating a parity check matrix H newly proposed by exemplary embodiments of the present invention are as follows. Check nodes are divided into p subsets, and each subset is defined as $S_1, \ldots, S_p$. A sum of degrees of check nodes belonging to each check node subset (for convenience, the terms 'check node subset' and 'subset' will be used to denote the same meaning) is referred to as a 'degree', and each of the sum of degrees of check nodes corresponding to thereto is defined as $D_1, \ldots, D_p$. When generating a matrix while adding variable nodes, the proposed method initializes value each of $D_1, \ldots, D_p$ to '0' before connecting the first edge.

The proposed method selects one node of the currently connected lowest-degree nodes among the check nodes, and connects the selected check node to the first edge to be connected to a variable node. At this point, the method increases, by 1, a value of a degree $D_p$ of a subset $S_p$ to which the connected check node $c_j$ belongs. Thereafter, the method generates a tree structure with the variable node as a starting node. As a depth of the tree structure increases by one stage, the number of cases where the tree structure is completed is 2. The first case is a case where there is not an additional neighboring check node added to the variable node before all check nodes are connected to the tree structure. The second case is a case where all check nodes neighbor each other in the tree structure. The term 'neighboring check nodes' as used herein denotes all check nodes connected by edges on the tree structure. In the above two cases, when selecting edges for connecting the variable node located in the top of the tree structure to check nodes, the proposed method selects non-neighboring check nodes, and selects the lowest-degree check node among check nodes whose subset degrees D have uniform values. Herein, the term 'uniform value' denotes that values of the subset degrees D are equal to each other, or a difference between the values of the subset degrees D is a maximum of 1. The operation is performed according to the above-stated algorithm until edges corresponding to a degree of each variable node are all connected. According to a characteristic of edges connected to a particular variable node, the matrix is generated such that a difference in the number of edges between the edges connected to all check node sets is less than or equal to a maximum of 1. This algorithm is summarized in Table 1.

TABLE 1 for (j=0; j<n; j++) {
   for (k=0; k<$d_{v_j}$; k++) {
     if(k==0) {
       Select the lowest-degree node $c_i$ among the check nodes of a graph generated up to now.
       $E_{v_j}^0 \leftarrow (c_i, v_j)$, $D_t = D_t + 1$ where $c_i \in S_t$
     }
     else {
       Extend the tree at a variable node $v_j$.
       (1) When the extension of the tree is stopped before all check nodes neighbor (depth l),
         →Select the lowest-degree check node $c_i$ among the check nodes belonging to $\overline{N}_{v_j}^l$, a degree D of its subset having the uniform value as that of other subsets.
         $E_{v_j}^k \leftarrow (c_i, v_j)$, $D_t = D_t + 1$ where $c_i \in S_t$ TABLE 1-continued (2) When all check nodes neighbor as the tree continues to extend,
         →Extend a tree that satisfies both $\overline{N}_{v_j}^l \neq \phi$ and $\overline{N}_{v_j}^{l+1} = \phi$, up to the depth l.
         Select the lowest-degree check node $c_i$ among the check nodes belonging to $\overline{N}_{v_j}^l$, a degree D of its subset having the uniform value as that of other subsets.
         $E_{v_j}^k \leftarrow (c_i, v_j)$, $D_t = D_t + 1$ where $c_i \in S_t$
     }
   }
}

In Table 1, $v_j$ denotes a $j^{th}$ variable node, $d_{v_j}$ denotes a degree of $v_j$, $E_{v_j}^k$ denotes a $(k+1)^{th}$ edge among the edges connected to $v_j$, $\overline{E}_{v_j}^l$ denotes check node sets which are neighboring when the tree having $v_j$ as a starting node is extended by depth l, and $\overline{N}_{v_j}^l$ denotes the remaining check node sets determined by excepting $N_{v_j}^l$ from all check nodes.

The first loop of Table 1 corresponds to extending the tree while sequentially attaching variable nodes, and the second loop corresponds to sequentially connecting $d_{v_j}$ edges to be connected to a variable node. When a value of k is 0, the first edge among the edges to be connected to the variable node is connected. In this case, the algorithm selects one of the lowest-degree check nodes according to the connected edge. Thereafter, the algorithm connects the selected check node to the edge, and at the same time, increases, by 1, a degree of the subset to which the selected check node belongs. Further, the algorithm extends the tree according to one of the two cases (1) and (2) shown in Table 1, using the variable node as a starting point.

The first case (1) is a case where a new node does not include to $N_{v_j}^l$ even though a depth of the tree is increased. This may occur frequently when the early-stage variable node is connected, and the reason is that a new check node does not occur during tree extension, as the number of check nodes connected to the variable node is insufficient.

The second case (2) is a case where $N_{v_j}^l$ is not a set including all check nodes, and $N_{v_j}^{l+1}$ is a set including all check nodes. In this case, the algorithm selects the lowest-degree check node having the smallest value among the elements of $\overline{N}_{v_j}^l$. The algorithm checks if the edge to be connected next corresponds to one of the above two cases after reconfiguring the tree from the previously connected edges, and if all edges corresponding to $d_{v_j}$ are connected, it goes to the next variable node and repeats the process shown in Table 1.

Figure 2:
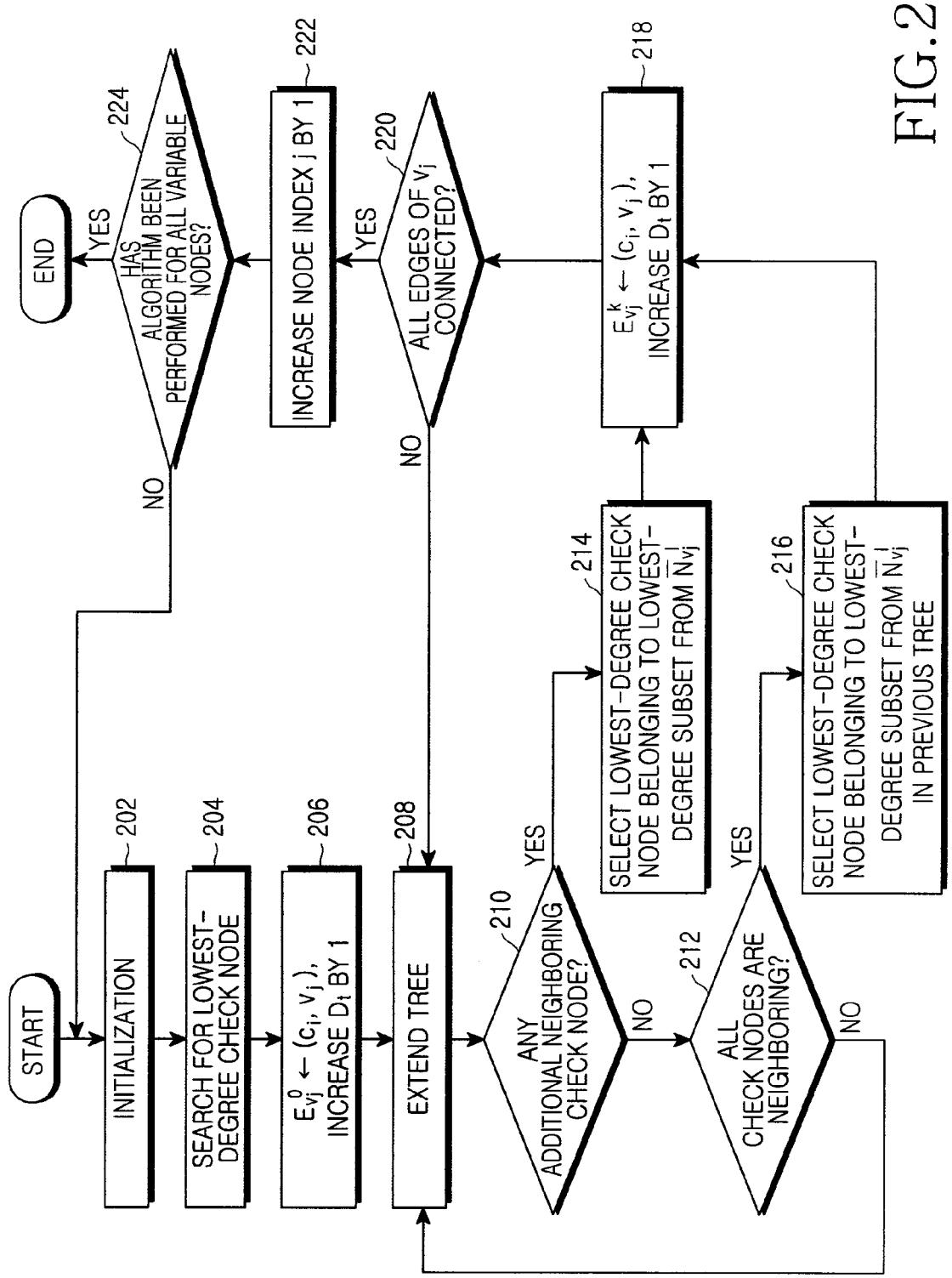
FIG. 2 is a flowchart illustrating a method for generating an LDPC code for efficient sequential decoding according to an exemplary embodiment of the present invention.

FIG. 2 is a flowchart illustrating an operation of the algorithm shown in Table 1 according to an exemplary embodiment of the present invention. Referring to FIG. 2, in step 202, the algorithm initializes value of D, $\{D_1, D_2, \ldots, D_p\}$ to $\{0, 0, \ldots, 0\}$. That is, in order to count the number of variable nodes connected to $v_j$, the algorithm initializes the value of D to 0, and increases it by 1 according to the connection of the variable node. In step 204, the algorithm searches for the lowest-degree check node among the check nodes in order to select the first edge to be connected to $v_j$. In step 206, the algorithm increases, by 1, a subset degree $D_t$ of the check node determined in step 204. In step 206, $E_{v_j}^0$ denotes the first edge connected to $v_j$, and $(c_i, v_j)$ is an ordered pair of a check node $c_i$ and a variable node $v_j$, and denotes an edge to which $c_i$ and $v_j$ are connected. That is, $E_{v_j}^0 \leftarrow (c_i, v_j)$ denotes determining the edge defined as $(c_i, v_j)$, as the first edge connected to $v_j$. The 1-increase in a value of $D_t$ denotes increasing, by 1, a value of $D_t$ when a degree of a subset $S_t$ to which $c_i$ belongs is defined as $D_t$.

After connecting the first edge of $v_j$, the algorithm extends the tree structure having $v_j$ as a starting node in step 208. If a depth of the tree is defined as 1, in depth 0 are included the $v_j$ and all check nodes connected to the $v_j$, and in depth 1 are included variable nodes connected to the check nodes included in depth 0 and check nodes connected to the variable nodes. It is possible to extend the tree structure by connecting the variable nodes and the check nodes up to the depth l in this manner.

Figure 3A:
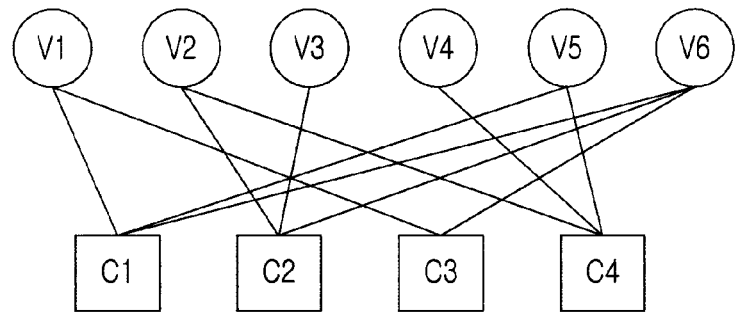
FIGS. 3A and 3B are diagrams illustrating a tree structure according to an exemplary embodiment of the present invention.
Figure 3B:
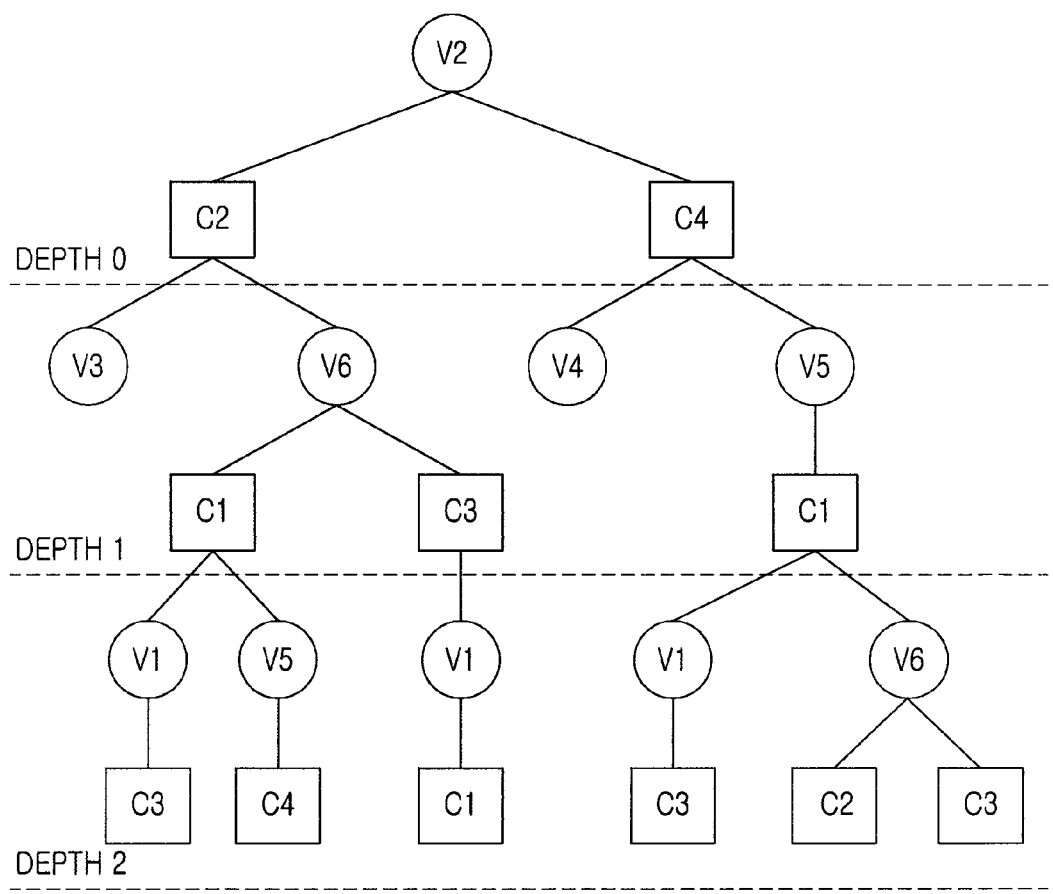

FIGS. 3A and 3B are diagrams illustrating a tree structure generated in this manner according to an exemplary embodiment of the present invention. FIG. 3A illustrates an example where 6 variable nodes and 4 check nodes are connected according to the scheme proposed by an exemplary embodiment of the present invention. FIG. 3B illustrates an example where the tree structure is extended up to depth 2 using a variable node V2 as a starting node, in order to connect the variable nodes and the check nodes as shown in FIG. 3A, according to an exemplary embodiment of the present invention.

In order to extend the tree structure as illustrated in FIG. 3B, the algorithm performs steps 210 and 212, and determines which of the two steps is satisfied. In step 210, the algorithm detects a case where there is no newly added check node during comparison with the previous depth even though the tree is further extended. In step 212, the algorithm detects a case where all check nodes neighbor each other in the tree structure having $v_j$ as a starting node. However, if none of the two steps is satisfied, the algorithm returns to step 208 where it increases the tree depth by one level.

If step 210 of the two steps is satisfied, the algorithm proceeds to step 214 where it selects the lowest-degree node taking into account degrees of the check nodes included in $N_{v_j}^l$ and a degree of a subset to which the check nodes belong. On the other hand, if step 212 of the two steps is satisfied, the algorithm proceeds to step 216 where it selects the lowest-degree node taking into account degrees of check nodes included in $\overline{N}_{v_j}^l$ in the tree structure generated in the previous-level depth, and a degree of a subset to which the check nodes belong. In order to uniformly connect the check nodes to each subset, when a degree of the subset reaches the maximum value, the check nodes corresponding to the subset are excluded from $\overline{N}_{v_j}^l$. After the check nodes are determined according to steps 214 and 216, the algorithm proceeds to step 218 where it connects a $(k+1)^{th}$ edge of $v_j$ and increases, by 1, a value of $D_t$ of the check node connected to the $v_j$.

In step 220, the algorithm determines if all edges of $v_j$ are connected according to $d_{v_j}$, and if all edges are not connected, the algorithm returns to step 208. However, if all edges are connected, the algorithm proceeds to step 222 where it shifts to $v_{j+1}$. In step 224, the algorithm determines if steps 202 to 222 have been performed on all variable nodes. If steps 202 to 222 have not been performed on all variable nodes, the algorithm returns to step 202.

Figure 4:
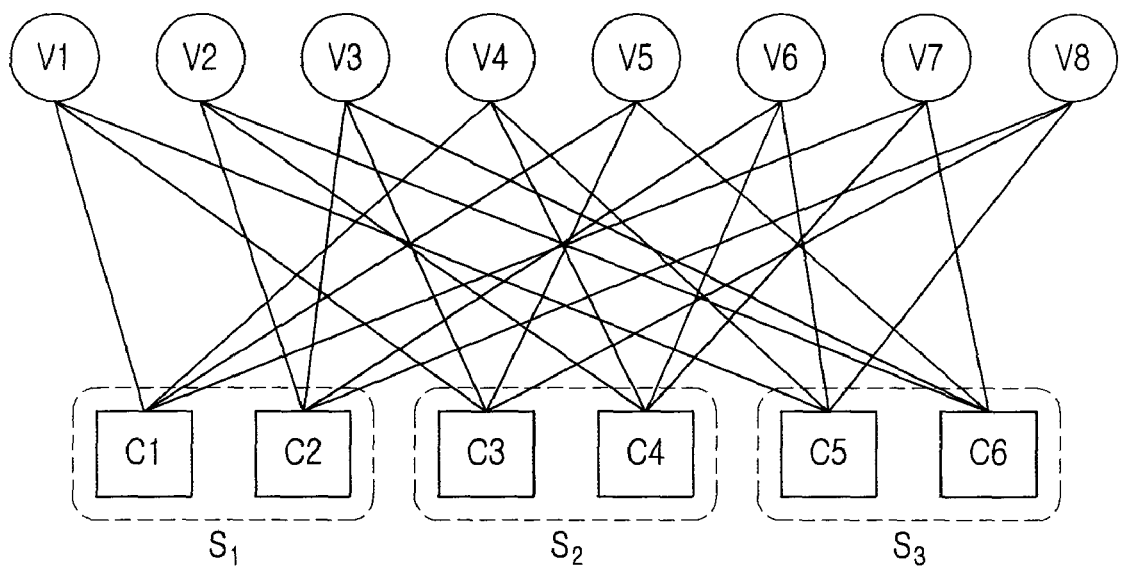
FIG. 4 is a bipartite graph illustrating an LDPC code according to an exemplary embodiment of the present invention.

FIG. 4 is a bipartite graph illustrating an LDPC code for which a length is 8, a degree of a variable node is 3, a degree of a check node is 4, and the number of check node subsets is 3, according to an exemplary embodiment of the present invention. Referring to FIG. 4, circles represent variable nodes, and rectangles represent check nodes. In order to uniformly connect the illustrated variable nodes and check node subsets, each variable node is connected to each subset one by one, and a value of D of each subset becomes {1,1,1}. The decoding method performs decoding beginning from the variable nodes connected to each of the subsets.

Figure 5A:
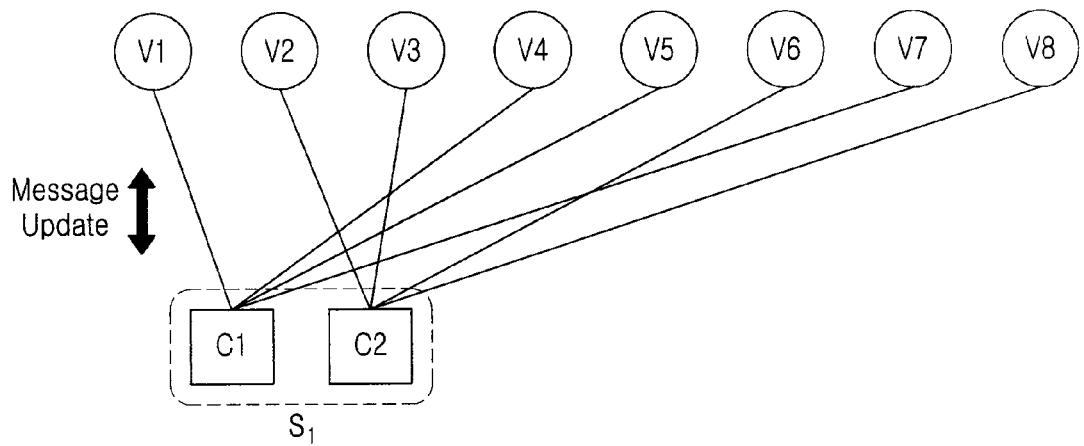
FIGS. 5A to 5C are diagrams illustrating sequential decoding of the LDPC code of FIG. 4, according to an exemplary embodiment of the present invention.
Figure 5B:
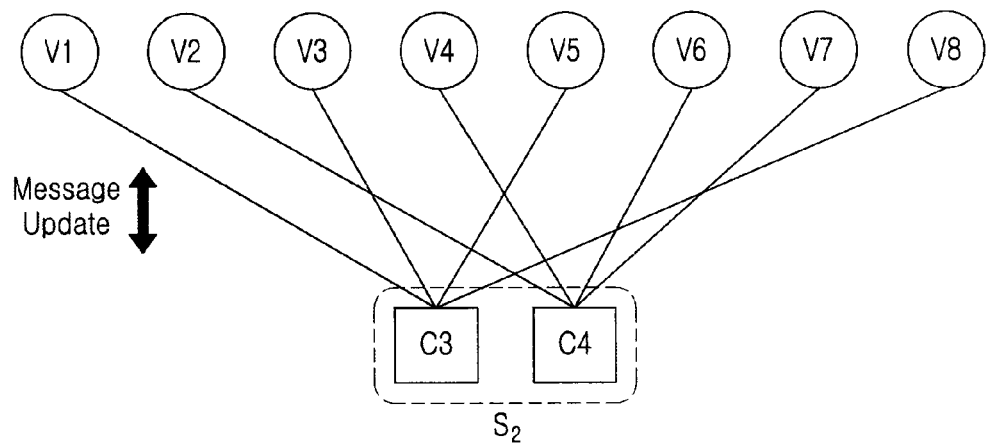
Figure 5C:
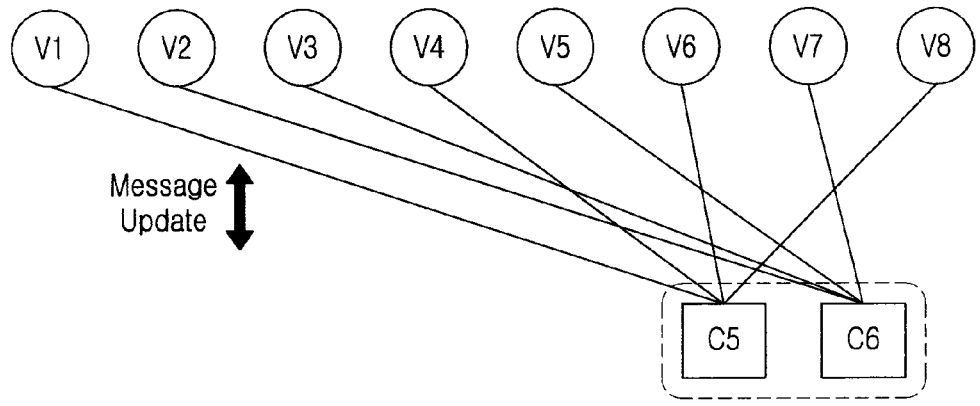

FIGS. 5A to 5C are diagrams illustrating sequential decoding based on check node subsets according to an exemplary embodiment of the present invention.

Referring to FIGS. 5A to 5C, the proposed algorithm calculates a message using information being input to all check nodes included in a particular subset, and delivers the calculated information to the connected variable nodes. Thereafter, the algorithm updates the message by repeating the above process for all check nodes included in the particular subset and other subsets. The algorithm performs one-iteration by updating the message for all subsets.

FIGS. 6 to 13 illustrate examples of generating a regular LDPC code illustrated in FIG. 4 using the method proposed by exemplary embodiments of the present invention. The regular LDPC code denotes an LDPC code for which variable nodes are equal in degree and check nodes are also equal in degree. FIGS. 6 to 13 are each illustrated by a bipartite graph and its associated matrix. The 3 sub-drawings A, B and C illustrate connections of the first edge, the second edge and the third edge for a particular variable node, respectively.

Figure 6A:
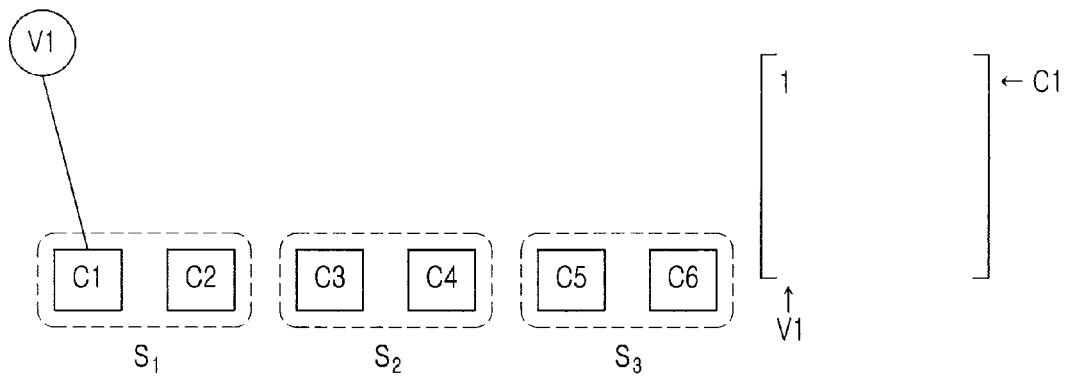
FIGS. 6A to 13C are diagrams illustrating examples of generating an LDPC code with length=8, variable node degree=3, and check node degree=4, according to an algorithm of an exemplary embodiment of the present invention.
Figure 6B:
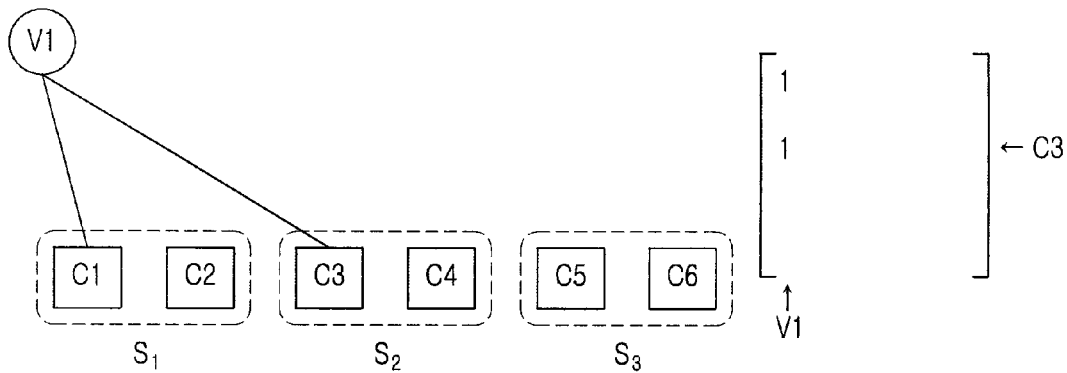
Figure 6C:
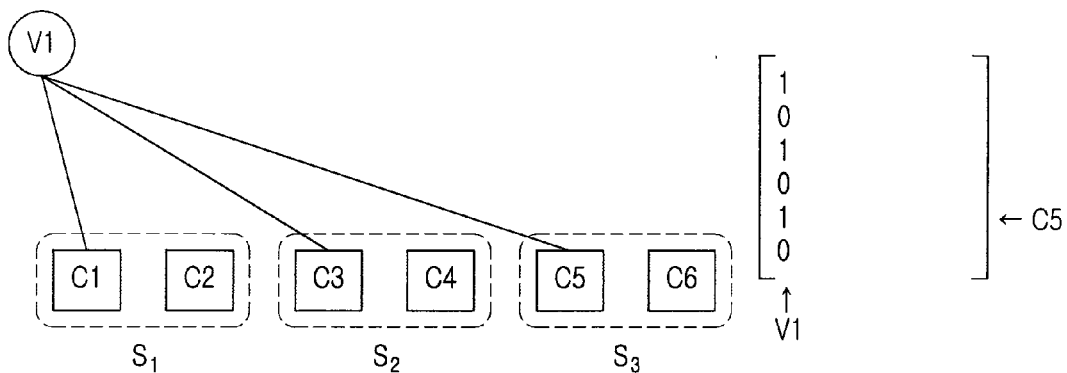

FIGS. 6A to 6C are diagrams illustrating a method of connecting three edges of V1 according to an exemplary embodiment of the present invention.

Referring to FIG. 6A, the proposed algorithm initializes degrees D1, D2 and D3 of subsets S1, S2 and S3 to '0' according to step 202 of FIG. 2, and selects one lowest-degree node among C1, C2, C3, C4, C5 and C6 and connects the selected node to V1 according to step 204. Since degrees of all check nodes are equal to '0', the algorithm selects one arbitrary node, and in FIG. 6A, C1 is assumed to be selected, for convenience. The algorithm connects C1 and V1, and increases, by 1, a value of D1 of S1 to which the C1 belongs, according to step 206.

Referring to FIG. 6B, the algorithm extends the tree structure according to step 208. Since a value of $D_1$ has become 1, C2 is excluded from $\overline{N}_{v_1}^l$. Since only one edge is connected to V1, neither of steps 210 and 212 is satisfied. Therefore, the algorithm extends a depth of the tree to 1 according to step 208.

Thereafter, since there is no additional neighboring check node, the algorithm selects one of C3, C4, C5 and C6 included in the lowest-degree subsets $S_2$ and $S_3$ according to step 214. For convenience, in FIG. 6B, C3 is assumed be selected. The algorithm connects C3 and V1, and increases, by 1, a value of $D_2$ of $S_2$ to which the C3 belongs, according to step 218.

Referring to FIG. 6C, since a degree of V1 is 3, the algorithm proceeds to step 208 according to step 220. First, since values of $D_1$ and $D_2$ have become '1', C2 and C4 are excluded from $\overline{N}_{v_1}^l$. Thereafter, since there is no additional neighboring check node, when a depth of the tree is extended to 1, the algorithm selects one of C5 and C6 included in the lowest-degree subset $S_3$ according to step 214. For convenience, in FIG. 6C, C5 is assumed to be selected. The algorithm connects C5 and V1, and increases, by 1, a value of $D_3$ of $S_3$ to which the C5 belongs, according to step 218.

When all the 3 edges are connected according to a degree of V1, the algorithm proceeds to the next variable node V2 according to step 222, and since it has not yet performed tree extension on all variable nodes, the algorithm returns to step 202.

Figure 7A:
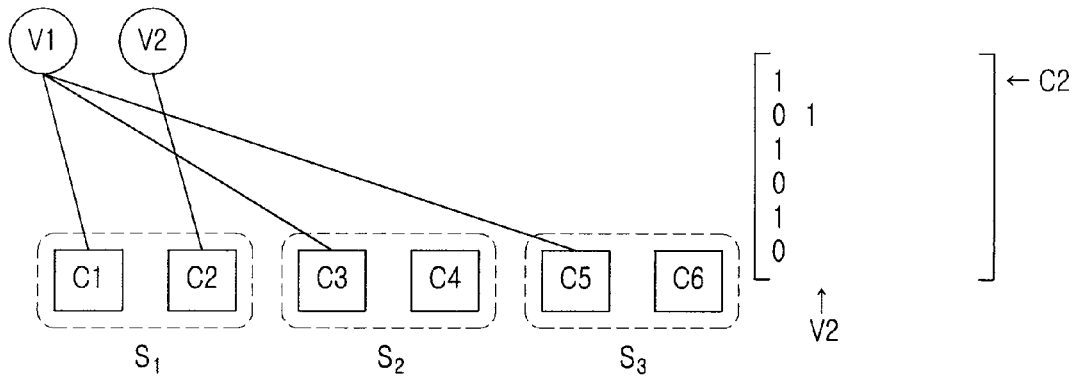
Figure 7B:
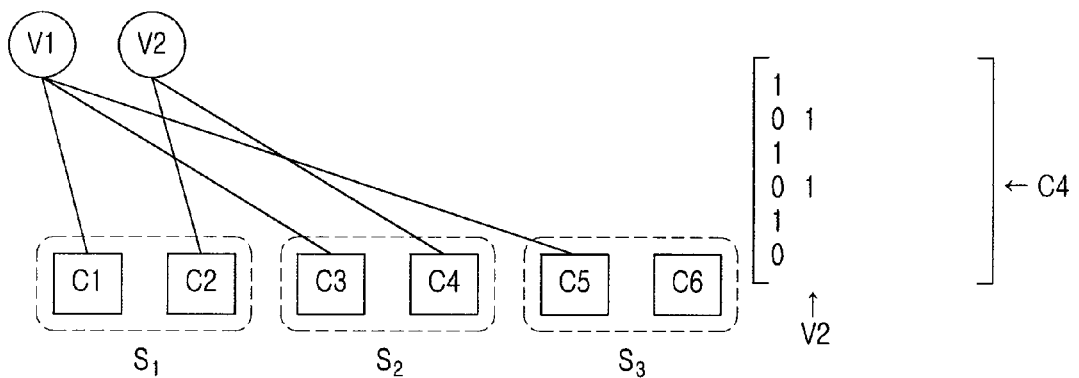
Figure 7C:
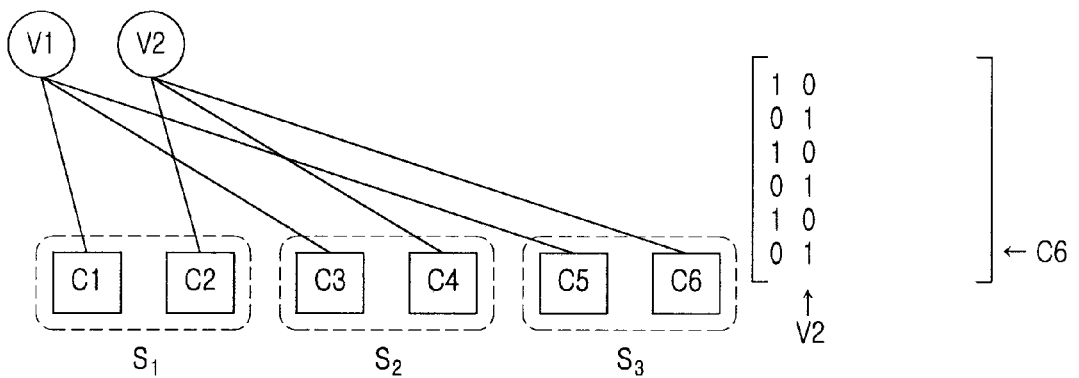

FIGS. 7A to 7C are diagrams illustrating a method of connecting three edges of V2 according to an exemplary embodiment of the present invention.

Referring to FIG. 7A, the algorithm initializes $D_1$, $D_2$ and $D_3$ to '0', selects one arbitrary node among the lower-degree check nodes C2, C4 and C6, and connects the selected node to V2. For convenience, in FIG. 7A, C2 is assumed to be selected. The algorithm connects C2 and V2, and increases, by 1, a value of $D_1$ of $S_1$ to which the C2 belongs.

Referring to FIG. 7B, the algorithm extends a depth of the tree to 1, and since there is no additional neighboring check node, the algorithm selects one of the lowest-degree check nodes C4 and C6 among the check nodes included in the lowest-degree subsets $S_2$ and $S_3$. For convenience, in FIG. 7B, C4 is assumed to be selected. The algorithm connects C4 and V2, and increases, by 1, a value of $D_2$ of $S_2$ to which the C4 belongs.

Referring to FIG. 7C, since there is no additional neighboring check node, when a depth of the tree is extended to 1, the algorithm selects the lowest-degree check node C6 included in the lowest-degree subset $S_3$.

Figure 8A:
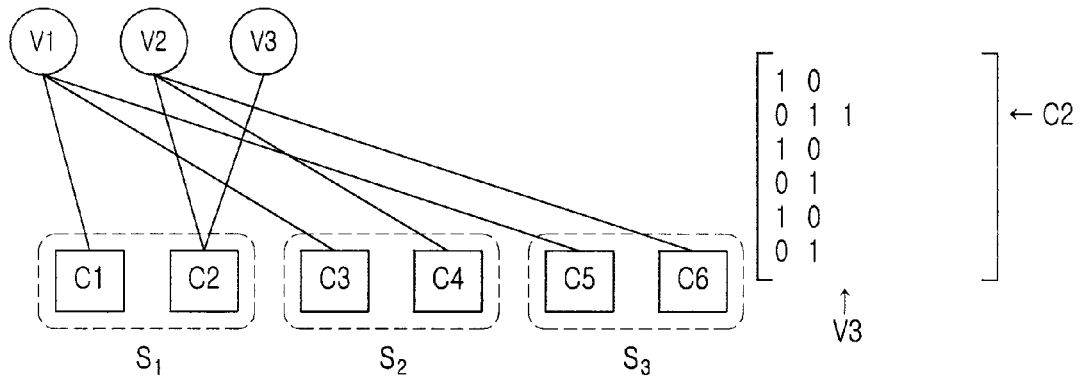
Figure 8B:
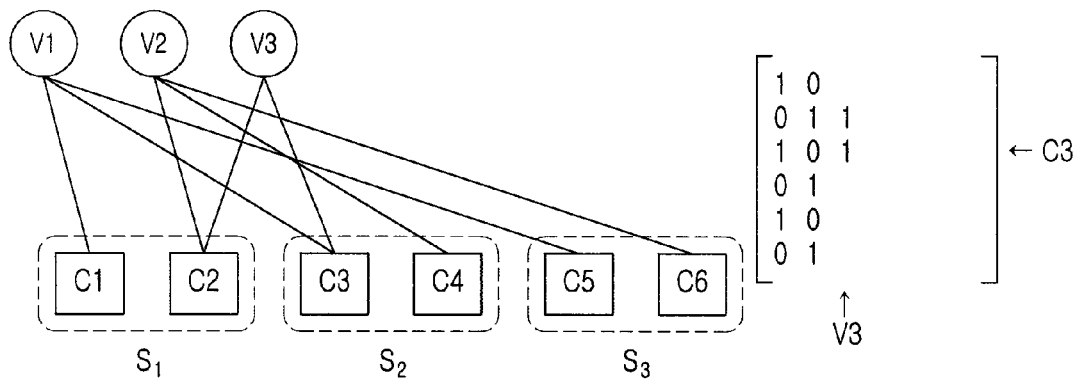
Figure 8C:
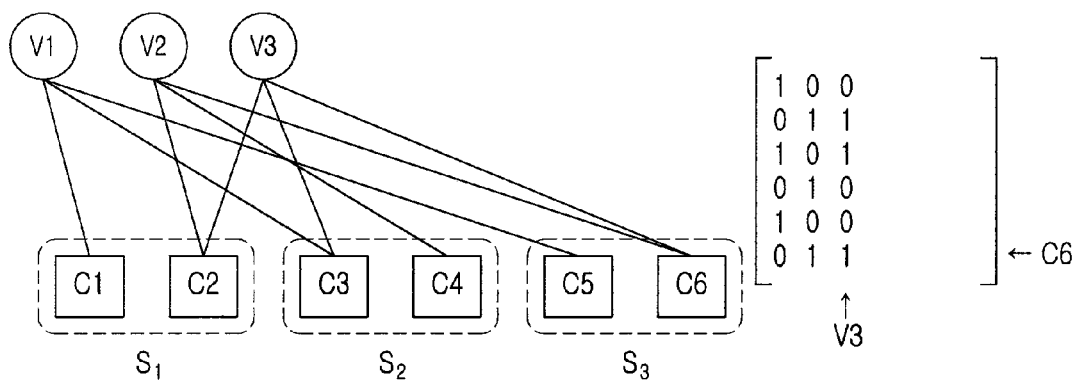

FIGS. 8A to 8C are diagrams illustrating a method of connecting three edges of V3 according to an exemplary embodiment of the present invention.

Referring to FIG. 8A, the algorithm initializes $D_1$, $D_2$ and $D_3$ to '0', and searches for the lowest-degree check node. Here, since degrees of all check nodes are 1, the algorithm selects one arbitrary node among C1, C2, C3, C4, C5 and C6. For convenience, in FIG. 8A, C2 is assumed to be selected. The algorithm connects C2 and V3, and increases, by 1, a value of $D_1$ of $S_1$ to which the C2 belongs.

Referring to FIG. 8B, when a depth of the tree is extended to 1, V2, C4 and C6 are connected to C2. However, since there is no additional neighboring check node, the algorithm selects one of the lowest-degree check nodes C3 and C5 included in the lowest-degree subsets $S_2$ and $S_3$ among the check nodes which are not connected to V3 in depth 1 of the tree. For convenience, in FIG. 8B, C3 is assumed to be selected. The algorithm connects C3 and V3, and increases, by 1, a value of $D_2$ of $S_2$ to which the C3 belongs.

Referring to FIG. 8C, when a depth of the tree is extended to 1, V2, C4 and C6 are connected to C2, and V1, C1 and C5 are connected to C3. That is, since all check nodes become neighboring nodes, the algorithm selects one of the lowest-degree check nodes C5 and C6 included in the lowest-degree subset $S_3$ among the check nodes which are not connected to V3 in depth 0 of the tree. For convenience, in FIG. 8C, C6 is assumed to be selected. The algorithm connects C6 and V3, and increases, by 1, a value of $D_3$ of $S_3$ to which the C6 belongs.

Figure 9A:
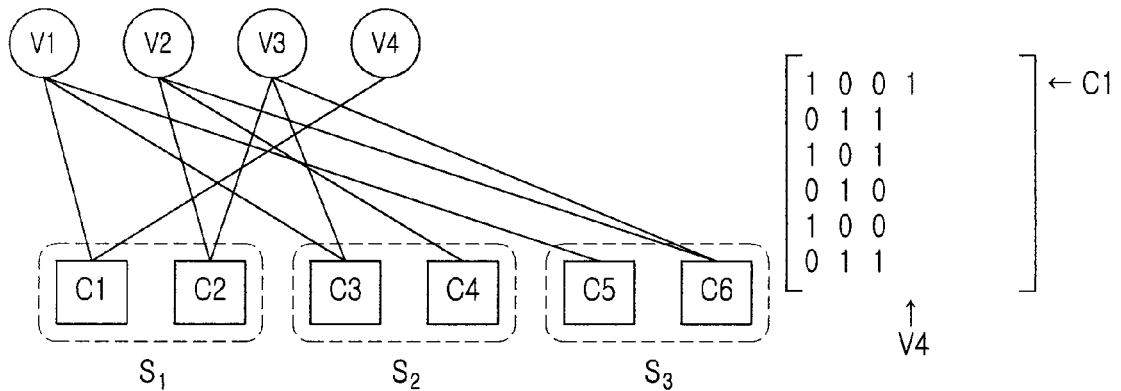
Figure 9B:
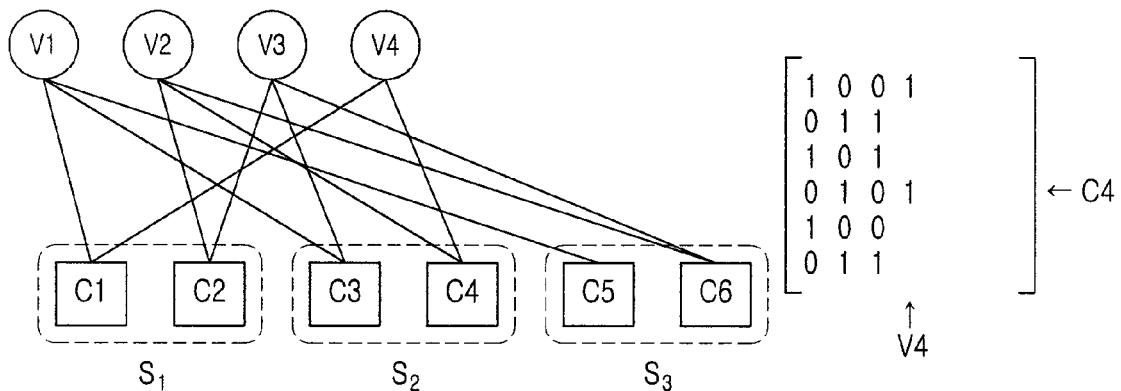
Figure 9C:
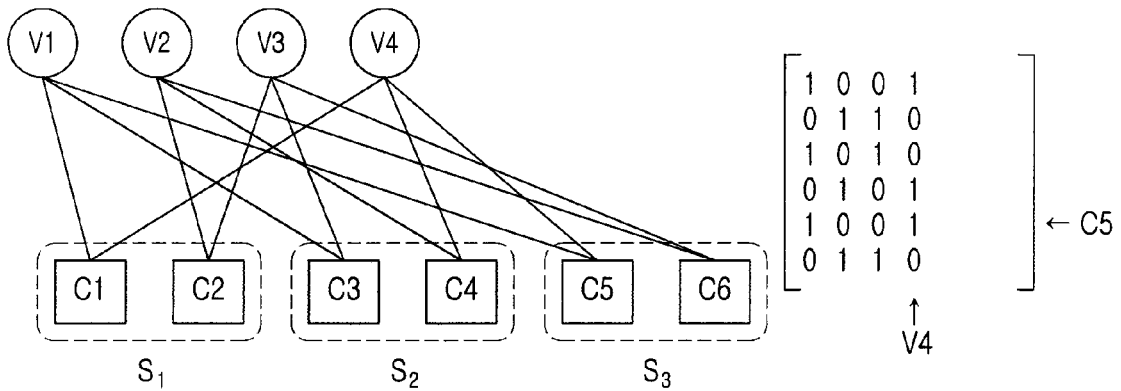

FIGS. 9A to 9C are diagrams illustrating a method of connecting three edges of V4 according to an exemplary embodiment of the present invention.

Referring to FIG. 9A, the algorithm initializes $D_1$, $D_2$ and $D_3$ to '0', and selects one arbitrary node among the lowest-degree check nodes C1, C4 and C5. For convenience, in FIG. 9A, C1 is assumed to be selected. The algorithm connects C1 and V4, and increases, by 1, a value of $D_1$ of $S_1$ to which the C1 belongs.

Referring to FIG. 9B, C1 is connected to V4 in depth 0 of the tree, and V1, C3 and C5 are connected to C1 in depth 1 of the tree. Since there is no additional neighboring check node, if the algorithm extends a depth of the tree to 2, V3, C2 and C6 connected to C3. Further, if the algorithm extends a depth of the tree to 3, V2, C4 and C6 are connected to the C2, and V2, C2 and C4 are connected to C6. That is, since all check nodes become neighboring nodes, the algorithm selects the check node C4 which is not connected to V4 in depth 2 of the tree. The algorithm connects C4 and V4, and increases, by 1, a value of $D_2$ of $S_2$ to which the C4 belongs.

Referring to FIG. 9C, C1 and C4 are connected to V4 in depth 0 of the tree. In depth 1 of the tree, V1, C3 and C5 are connected to C1, and V2, C2 and C6 are connected to C4. That is, since all check nodes become neighboring nodes, the algorithm selects the lowest-degree check node C5 included in the lowest-degree subset $S_3$ among the check nodes which are not connected to V4 in depth 0 of the tree. The algorithm connects C5 and V4, and increases, by 1, a value of $D_3$ of $S_3$ to which the C5 belongs.

Figure 10A:
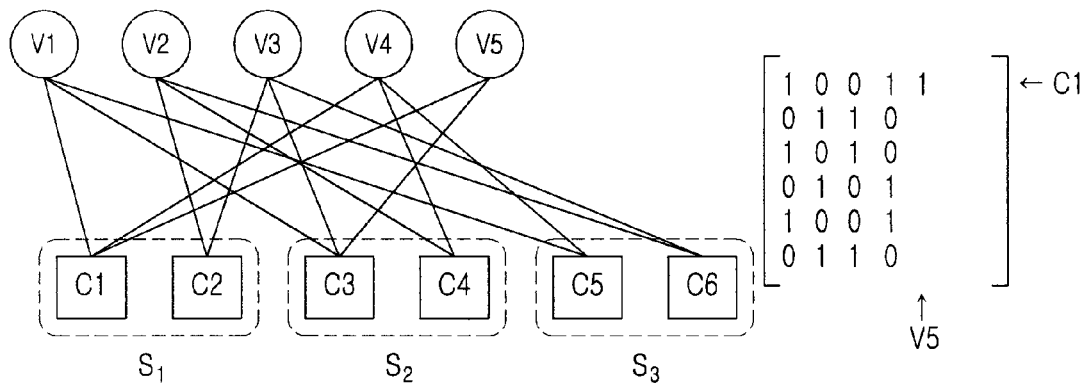
Figure 10B:
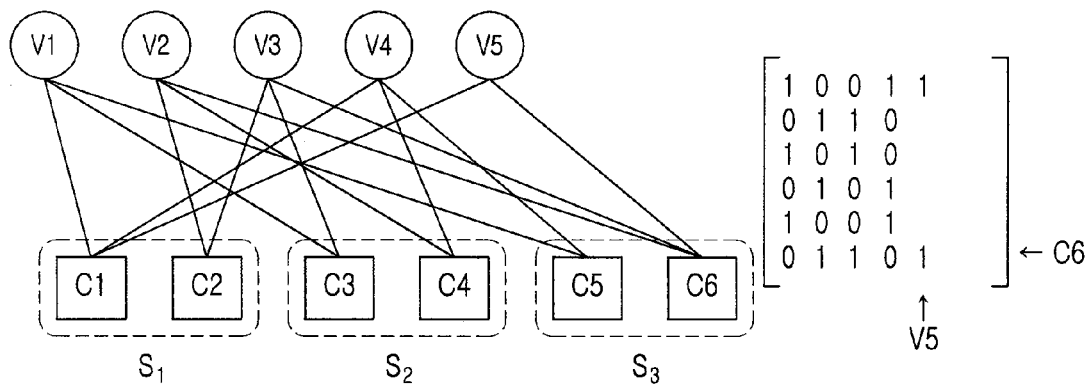
Figure 10C:
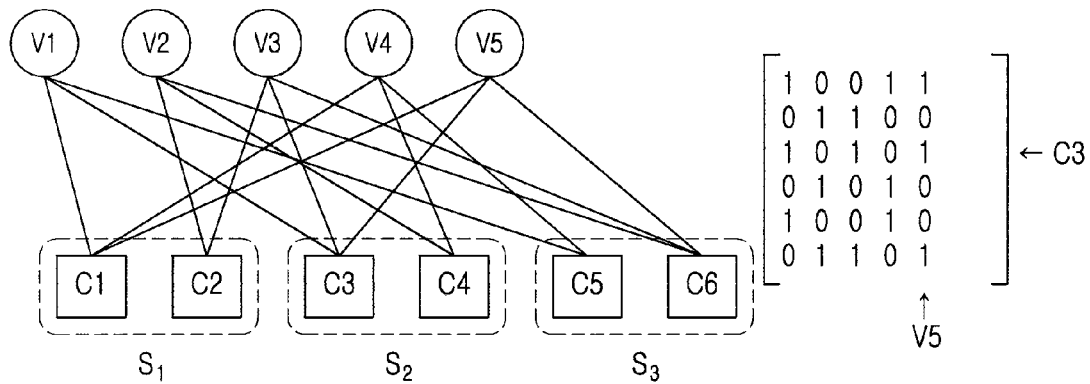

FIGS. 10A to 10C are diagrams illustrating a method of connecting three edges of V5 according to an exemplary embodiment of the present invention.

Referring to FIG. 10A, the algorithm initializes $D_1$, $D_2$ and $D_3$ '0', and searches for the lowest-degree check node. Here, since degrees of all check nodes are 2, the algorithm selects one arbitrary node among C1, C2, C3, C4, C5 and C6. For convenience, in FIG. 10A, C1 is assumed to be selected. The algorithm connects C1 and V5, and increases, by 1, a value of $D_1$ of $S_1$ to which the C1 belongs.

Referring to FIG. 10B, C1 is connected to V5 in depth 0 of the tree, and V1, C3, C5, V4, C4 and C5 are connected to C1 in depth 1 of the tree. Since there is no additional neighboring check node, if the algorithm extends a depth of the tree to 2, V3, C2, C6, V4, C1, C4, V2, C2, C6, V1, C1 and C3 are connected to C3. That is, since all check nodes become neighboring nodes, the algorithm selects C6 included in the lowest-degree subsets $S_2$ and $S_3$ among the check nodes which are not connected to V5 in depth 1 of the tree. The algorithm connects C6 and V5, and increases, by 1, a value of $D_3$ of $S_3$ to which the C6 belongs.

Referring to FIG. 10C, C1 and C6 are connected to V5 in depth 0 of the tree. In depth 1 of the tree, V1, C3, C5, V4, C4 and C5 connected to C1, and V2, C2, C4, V3, C2 and C3 are connected to C6. That is, since all check nodes become neighboring nodes, the algorithm selects one arbitrary node of the lowest-degree check nodes C3 and C4 included in the lowest-degree subset $S_2$ among the check nodes which are not connected to V5 in depth 0 of the tree. For convenience, in FIG. 10C, C3 is assumed to be selected. The algorithm connects C3 and V5, and increases, by 1, a value of $D_2$ of $S_2$ to which the C3 belongs.

Figure 11A:
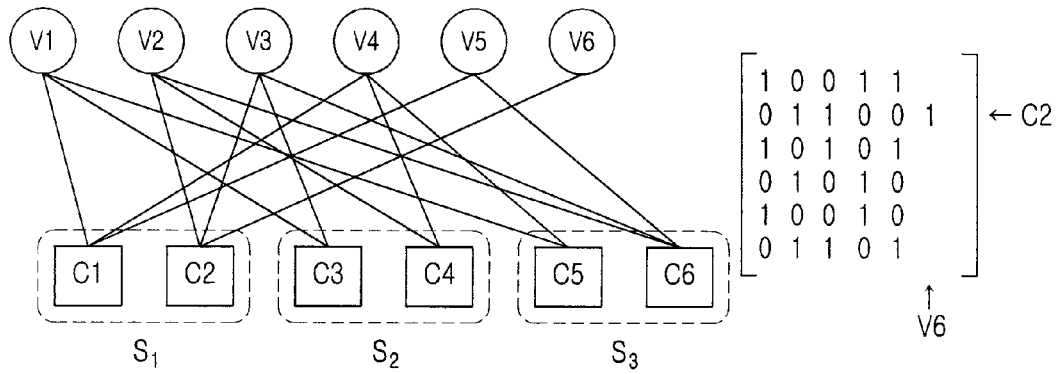
Figure 11B:
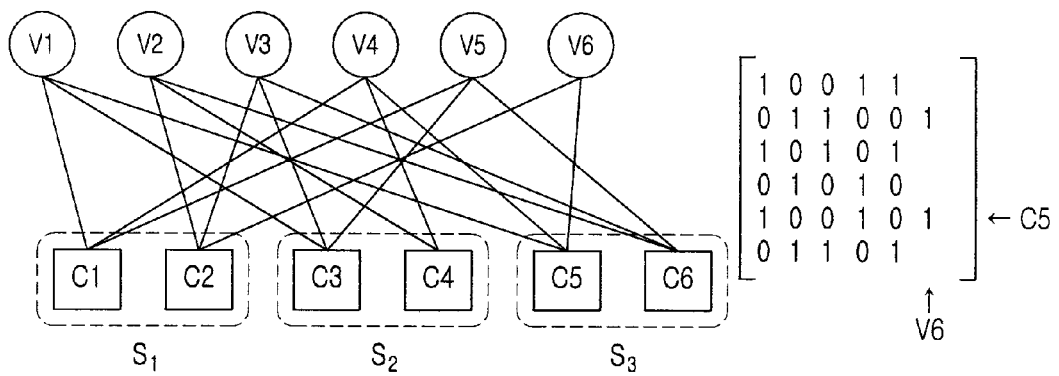
Figure 11C:
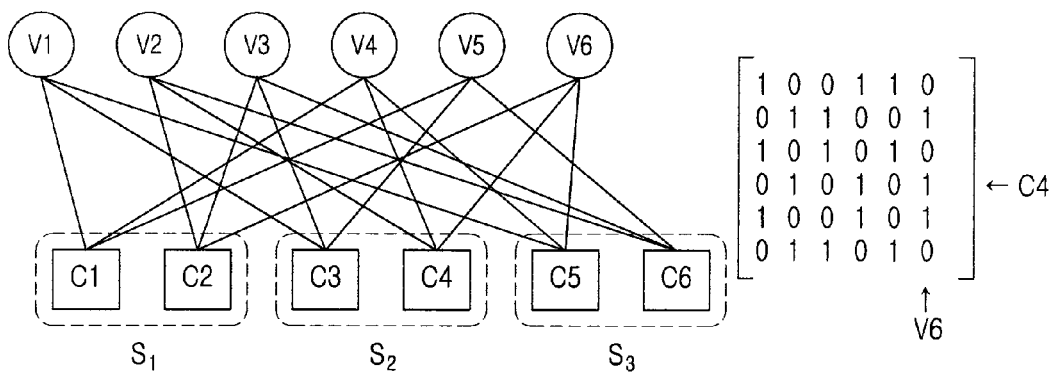

FIGS. 11A to 11C are diagrams illustrating a method of connecting three edges of V6 according to an exemplary embodiment of the present invention.

Referring to FIG. 11A, the algorithm initializes $D_1$, $D_2$ and $D_3$ to '0', and selects one arbitrary node among the lowest-degree check nodes C2, C3, C4 and C5. For convenience, in FIG. 11A, C2 is assumed to be selected. The algorithm connects C2 and V6, and increases, by 1, a value of $D_1$ of $S_1$ to which the C2 belongs.

Referring to FIG. 11B, C2 is connected to V6 in depth 0 of the tree, and V2, C4, C6, V3, C3 and C6 are connected to C2 in depth 1 of the tree. Since there is no additional neighboring check node, if the algorithm extends a depth of the tree to 2, V4, V1 and V5 are connected to C4; V3, C2, C3, V5 and C1 are connected to C6; V1, C1 and C5 are connected to C3; and V2, C2, C4, V5 and C1 are connected to C6. That is, since all check nodes become neighboring nodes, the algorithm selects the lowest-degree check node C5 included in the lowest-degree subsets $S_2$ and $S_3$ among the check nodes which are not connected to V6 in depth 1 of the tree. The algorithm connects C5 and V6, and increases, by 1, a value of $D_3$ of $S_3$ to which the C5 belongs.

Referring to FIG. 11C, C2 and C5 are connected to V6 in depth 0 of the tree. V2, C4, C6, V3, C3 and C6 are connected to C2 in depth 1 of the tree, and V1, C1, C3, V4, C1 and C4 are connected to C5. That is, since all check nodes become neighboring nodes, the algorithm selects the lowest-degree check node C4 included in the lowest-degree subset $S_2$ among the check nodes which are not connected to V6 in depth 0 of the tree. The algorithm connects C4 and V6, and increases, by 1, a value of $D_2$ of $S_2$ to which the C4 belongs.

Figure 12A:
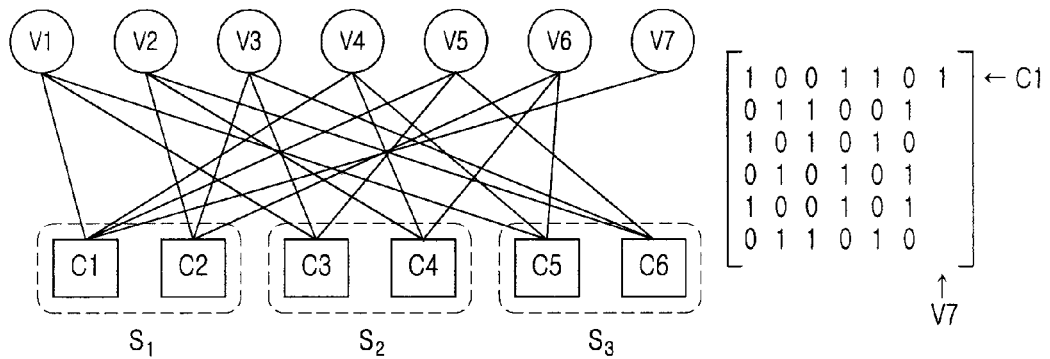
Figure 12B:
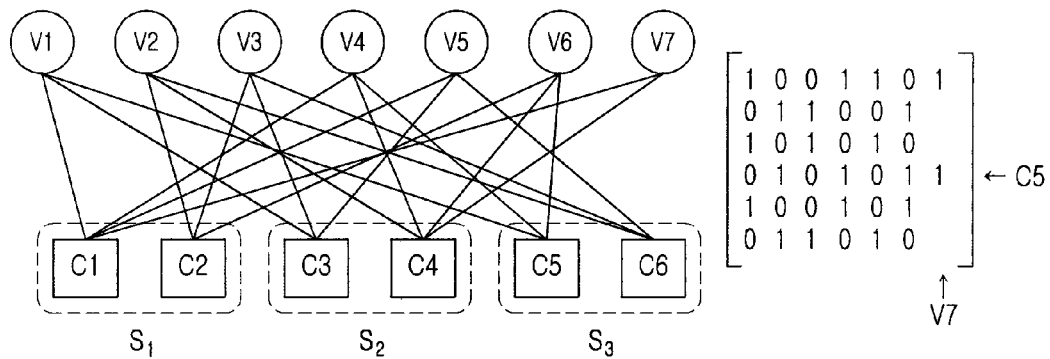
Figure 12C:
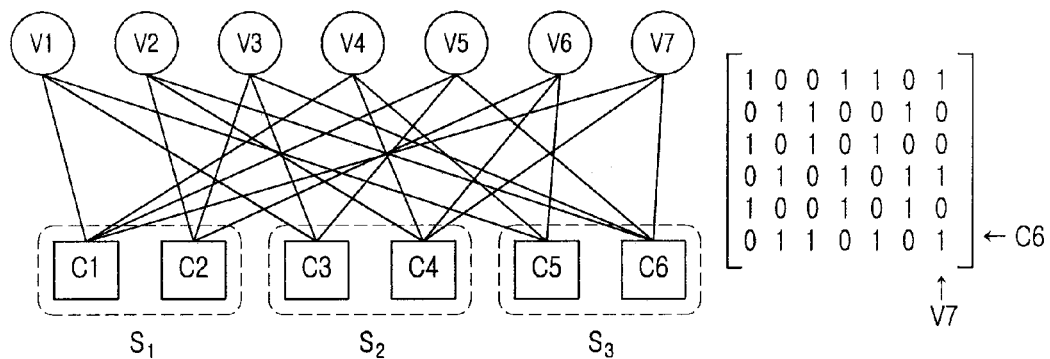

FIGS. 12A and 12C are diagrams illustrating a method of connecting three edges of V7 according to an exemplary embodiment of the present invention.

Referring to FIG. 12A, the algorithm initializes $D_1$, $D_2$ and $D_3$ to '0', and searches for the lowest-degree check node. Here, since degrees of all check nodes are 3, the algorithm selects one arbitrary node among C1, C2, C3, C4, C5 and C6. For convenience, in FIG. 12A, C1 is assumed to be selected. The algorithm connects C1 and V7, and increases, by 1, a value of $D_1$ of $S_1$ to which the C1 belongs.

Referring to FIG. 12B, C1 is connected to V7 in depth 0 of the tree, and V1, C3, C5, V4, C4, C5, V5, C3 and C6 are connected to C1 in depth 1 of the tree. Here, since a value of $D_1$ becomes 1 when the first edge of V7 is connected, it is considered that C2 is connected. Therefore, all check nodes become neighboring nodes. Thus, the algorithm selects one arbitrary node of C3, C4, C5 and C6 included in the lowest-degree subsets $S_2$ and $S_3$ among the check nodes which are not connected to V5 in depth 0 of the tree. For convenience, in FIG. 12B, C4 is assumed to be selected. The algorithm connects C4 and V7, and increases, by 1, a value of $D_2$ of $S_2$ to which the C4 belongs.

Referring to FIG. 12C, C1 and C4 are connected to V7 in depth 0 of the tree. In depth 1 of the tree, V1, C3, C5, V4, C4, C5, V5, C3 and C6 are connected to C1, and V2, C2, C6, V4, C1, C5, V6, C2 and C5 are connected to C4. That is, since all check nodes become neighboring nodes, the algorithm selects one arbitrary node of C5 and C6 included in the lowest-degree subset $S_3$ among the check nodes which are not connected to V6 in depth 0 of the tree. For convenience, in FIG. 12C, C6 is assumed to be selected. The algorithm connects C6 and V7, and increases, by 1, a value of $D_3$ of $S_3$ to which the C6 belongs.

Figure 13A:
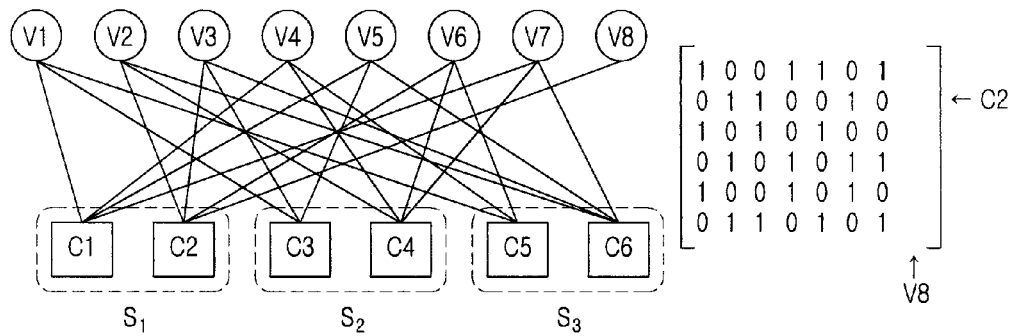
Figure 13B:
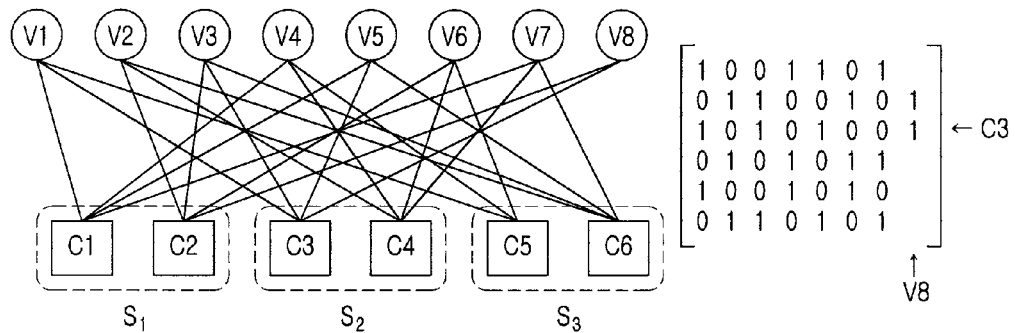
Figure 13C:
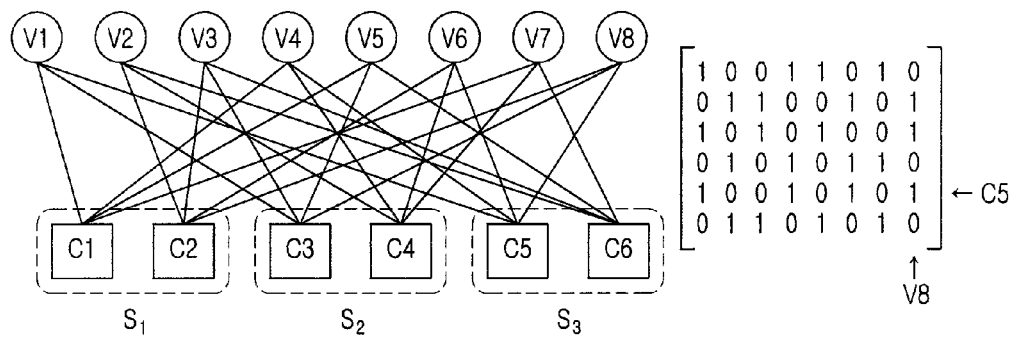

FIGS. 13A to 13C are diagrams illustrating a method of connecting three edges of V8 according to an exemplary embodiment of the present invention.

Referring to FIG. 13A, the algorithm initializes $D_1$, $D_2$ and $D_3$ to '0', and selects one arbitrary node among the lowest-degree check nodes C2, C3 and C5. For convenience, in FIG. 13A, C2 is assumed to be selected. The algorithm connects C2 and V8, and increases, by 1, a value of $D_1$ of $S_1$ to which the C2 belongs.

Referring to FIG. 13B, C2 is connected to V8 in depth 0 of the tree, and V2, C4, C6, V3, C3, C6, V6, C4 and C5 are connected to C2 in depth 1 of the tree. That is, since all check nodes become neighboring nodes, the algorithm selects one arbitrary node of the lowest-degree check nodes C3 and C5 included in the lowest-degree subsets $S_2$ and $S_3$ among the check nodes which are not connected to V8 in depth 0 of the tree. For convenience, in FIG. 13B, C3 is assumed to be selected. The algorithm connects C3 and V8, and increases, by 1, a value of $D_2$ of $S_2$ to which the C3 belongs.

Referring to FIG. 13C, C2 and C3 are connected to V8 in depth 0 of the tree. In depth 1 of the tree, V2, C4, C6, V3, C3, C6, V6, C4 and C5 connected to C2, and V1, C1, C5, V3, C2, C6, V5, C1 and C6 connected to C3. That is, since all check nodes become neighboring nodes, the algorithm selects the lowest-degree check node C5 included in the lowest-degree subset $S_3$ among the check nodes which are not connected to V8 in depth 0 of the tree. The algorithm connects C5 and V8, and increases, by 1, a value of $D_3$ of $S_3$ to which the C5 belongs.

Figure 14:
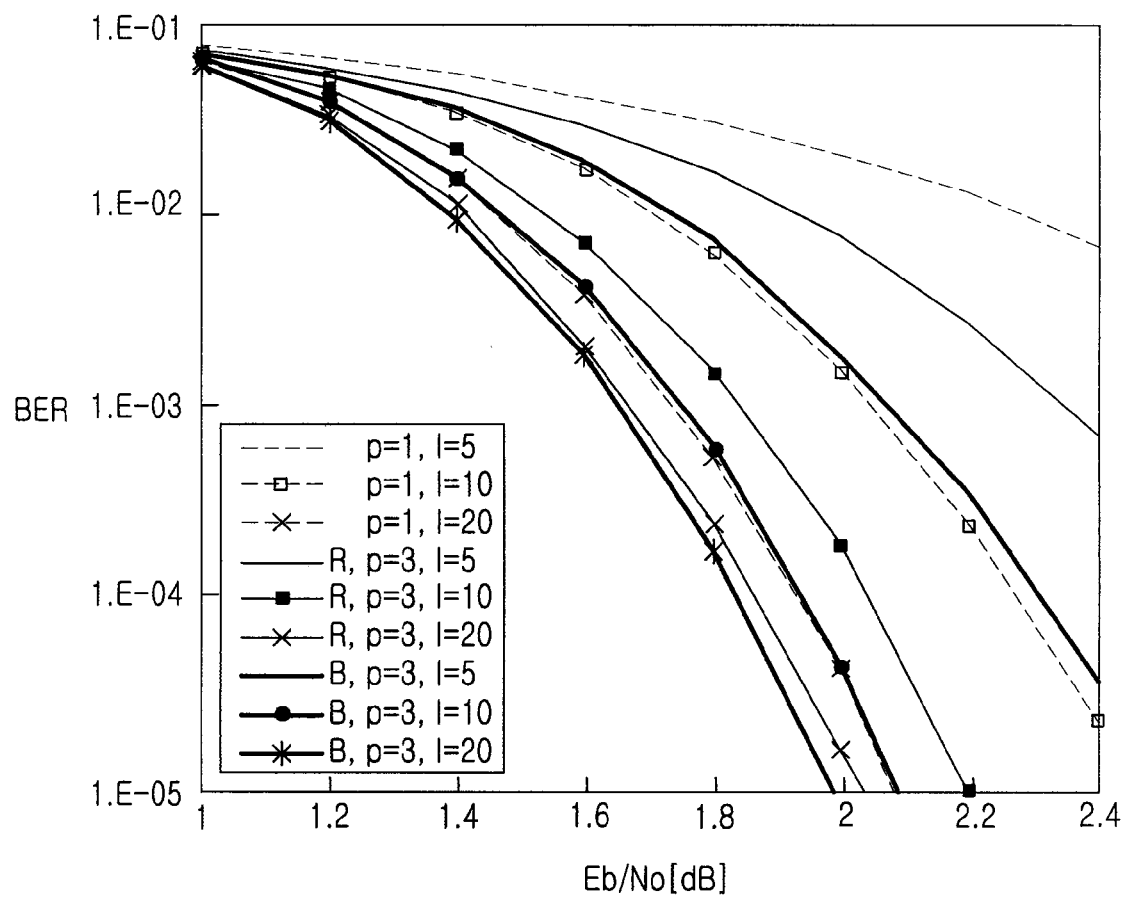
FIG. 14 is a graph illustrating BER performance of a regular LDPC code according to an exemplary embodiment of the present invention.

FIG. 14 is a graph illustrating Bit Error Rate (BER) performance of a regular LDPC code with respect to Signal-to-Noise Ratio (SNR), in which a code rate is 1/2, a length is 3000, a degree of a variable node is 3 and a degree of a check node is 6, according to an exemplary embodiment of the present invention.

As to the channel environment, it is considered that Binary Phase Shift Keying (BPSK) modulation is performed under the Additional White Gaussian Noise (AWGN) channel environment. In the graph, p represents the number of subsets, I represents iteration, and BER represents a bit error rate.

Illustrated in FIG. 14 is a difference between BER performance of an LDPC code generated according to the conventional PEG algorithm and BER performance of an LDPC code generated according to the algorithm proposed by exemplary embodiments of the present invention, for p=1 or 3. Here, curves R represent the cases where an LDPC code is generated according to an arbitrarily generated parity check matrix H, and curves B represent the cases where an LDPC code is generated according to a parity check matrix H generated using the algorithm proposed by exemplary embodiments of the present invention.

It can be appreciated that BER performance of an LDPC code generated for p=3 is superior to BER performance of an LDPC code generated for p=1. In addition, for subsets including the same number of check nodes, when p=3, an LDPC code where subsets are considered is superior in BER performance to an LDPC code where subsets are not considered. More particularly, the performance improvement is noticeable for a low iteration, because the amount of information updated at a low iteration is greater than the amount of information updated at a high iteration.

Figure 15:
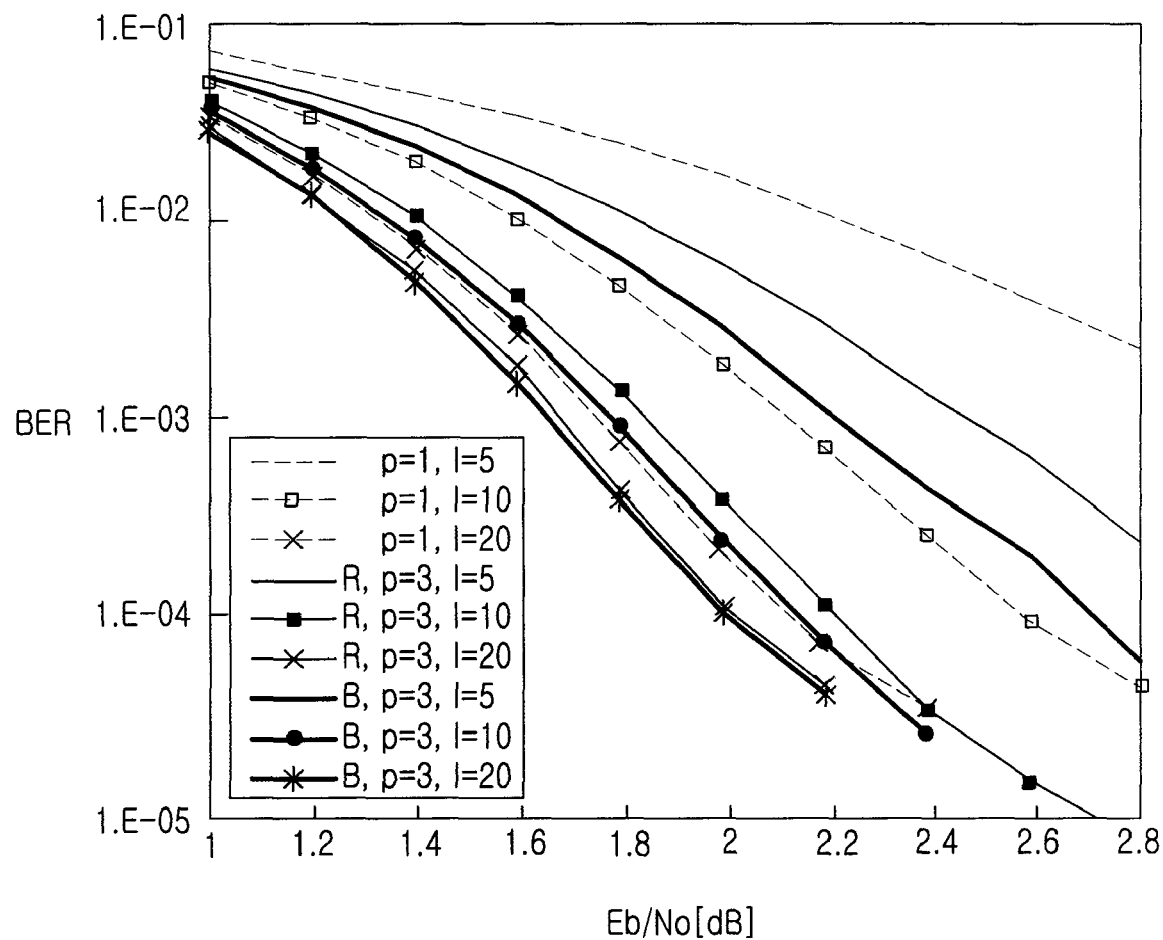
FIG. 15 is a graph illustrating BER performance of an irregular LDPC code according to an exemplary embodiment of the present invention.

FIG. 15 is a graph illustrating BER performance of an irregular LDPC code of which a degree distribution is $\lambda(x) = 0.332433x + 0.239904x^2 + 0.427662x^5$, a code rate is 1/2, and a length is 1200. The degree distribution means a ratio of the total number of connected edges to the number of edges determined by a degree of a particular variable node. In the degree distribution, degrees of X are 1, 2 and 5, and this denotes that degrees of variable nodes are 2, 3 and 6 determined by adding 1 to the degrees of X. Ratios of edges of the variable nodes with degree=2, 3 and 6 occupy 0.332433, 0.239904 and 0.427662 of all edges, respectively. Even BER performance thereof appears similar to the BER performance shown in the regular LDPC code.

As is apparent from the foregoing description, when applying an iterative decoding algorithm for performing sequential decoding during decoding of an LDPC code, exemplary embodiments of the present invention uniformizes the number of edges connected between variable nodes and subsets of check nodes, thereby increasing the amount of information updated within the same iteration. In addition, exemplary embodiments of the present invention generates an LDPC code considering subsets of check nodes, thus contributing to a decrease in BER of an arbitrarily generated LDPC code.

While the invention has been shown and described with reference to a certain exemplary embodiment thereof, it will be understood by those skilled in the art that various changes in form and details may be made therein without departing from the spirit and scope of the invention as defined by the appended claims and their equivalents.

What is claimed is:

1. An apparatus for generating a Low Density Parity Check (LDPC) code, the apparatus comprising:
   a channel matrix generator for generating subsets, each subset including a same number of check nodes, for connecting each of variable nodes to the check nodes of the subsets so that each of the subsets is equal in degree or a difference in degree between the subsets is a maximum of 1, for setting a number corresponding to the check nodes connected to each of the variable nodes to a non-zero value, and for generating a parity check matrix H having rows corresponding to the check nodes and columns corresponding to the variable nodes.

2. The apparatus of claim 1, wherein the channel matrix generator performs:
   a first step of connecting a first variable node among the variable nodes to a lowest-degree first check node among the check nodes, and increasing, by 1, a degree of a subset in which the first check node is included,
   a second step of increasing, by 1, a depth of a tree which is formed of the first variable node and check nodes which are directly connected to the first variable node or hierarchically connected to the first variable node through at least one different variable node,
   a third step of detecting a second check node based on the depth of the tree according to whether the first variable node has an additional check node and all check nodes neighbor the first variable node, and
   a fourth step of connecting the second check node to the first variable node, and increasing, by 1, a degree of a subset in which the second check node is included,
   wherein the depth of the tree is defined as the number of at least one different variable node included between the first variable node and each check node connected to the first variable node.

3. The apparatus of claim 2, wherein the channel matrix generator repeats the second to fourth steps for the first variable node.

4. The apparatus of claim 2, wherein when the first variable node has no additional check node, the channel matrix generator detects as the second check node a lowest-degree check node belonging to a lowest-degree subset among the check nodes not neighboring the first variable node, based on the depth of the tree.

5. The apparatus of claim 3, wherein when all check nodes neighbor the first variable node, the channel matrix generator detects as the second check node a lowest-degree check node belonging to a lowest-degree subset among the check nodes not neighboring the first variable node, based on the depth of the tree 1.

6. A method for generating a Low Density Parity Check (LDPC) code, the method comprising:
   generating subsets, each subset including a same number of check nodes;
   connecting each of variable nodes to the check nodes of the subsets so that each of the subsets is equal in degree or a difference in degree between the subsets is a maximum of 1;
   setting a number corresponding to check nodes connected to each of the variable nodes to a non-zero value; and
   generating a parity check matrix H having rows corresponding to the check nodes and columns corresponding to the variable nodes.

7. The method of claim 6, wherein connecting comprises:
   a first step of connecting a first variable node among the variable nodes to a lowest-degree first check node among the check nodes, and increasing, by 1, a degree of a subset in which the first check node is included;
   a second step of increasing, by 1, a depth of a tree used for counting a depth of a tree which is formed of the first variable node and check nodes which are directly connected to the first variable node or hierarchically connected to the first variable node through at least one different variable node;
   a third step of detecting a second check node based on the depth of the tree according to whether the first variable node has an additional check node and all check nodes neighbor the first variable node; and
   a fourth step of connecting the second check node to the first variable node, and increasing, by 1, a degree of a subset in which the second check node is included,
   wherein the depth of the tree is defined as the number of at least one different variable node included between the first variable node and each check node connected to the first variable node.

8. The method of claim 7, wherein connecting further comprises a fifth step of repeating the second to fourth steps for the first variable node.

9. The method of claim 7, wherein the third step comprises, when the first variable node has no additional check node, detecting as the second check node a lowest-degree check node belonging to a lowest-degree subset among the check nodes not neighboring the first variable node, based on the depth of the tree.

10. The method of claim 8, wherein the third step comprises, when all check nodes neighbor the first variable node, detecting as the second check node a lowest-degree check node belonging to a lowest-degree subset among the check nodes not neighboring the first variable node, based on the depth of the tree 1.

* * * * *